(12) United States Patent
Alissa et al.

(10) Patent No.: US 11,675,400 B2
(45) Date of Patent: Jun. 13, 2023

(54) SYSTEMS AND METHODS FOR COOLING A COMPUTING SYSTEM

(71) Applicant: Microsoft Technology Licensing, LLC, Redmond, WA (US)

(72) Inventors: Husam A. Alissa, Redmond, WA (US); Eric Clarence Peterson, Woodinville, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 334 days.

(21) Appl. No.: 16/740,998

(22) Filed: Jan. 13, 2020

(65) Prior Publication Data

US 2021/0216117 A1 Jul. 15, 2021

(51) Int. Cl.
G06F 1/20 (2006.01)
H05K 7/20 (2006.01)

(52) U.S. Cl.
CPC ........... *G06F 1/20* (2013.01); *H05K 7/20172* (2013.01); *H05K 7/20309* (2013.01); *H05K 7/20327* (2013.01); *H05K 7/20372* (2013.01); *G06F 2200/201* (2013.01)

(58) Field of Classification Search
CPC ..... G06F 1/20; H05K 7/20372; H01L 23/427; F25D 3/10
See application file for complete search history.

(56) References Cited

U.S. PATENT DOCUMENTS

| | | |
|---|---|---|
| 5,469,711 A | 11/1995 | Mccoy |
| 6,837,063 B1 | 1/2005 | Hood et al. |
| 7,243,507 B2 * | 7/2007 | Shapiro ............. H05K 7/20372 165/104.33 |
| 2005/0259397 A1 | 11/2005 | Bash et al. |
| 2006/0185379 A1 | 8/2006 | Shapiro |
| 2014/0218859 A1 | 8/2014 | Shelnutt et al. |
| 2018/0341300 A1 | 11/2018 | Han |

FOREIGN PATENT DOCUMENTS

GB 2449917 A 12/2008

OTHER PUBLICATIONS

"International Search Report and Written Opinion Issued in PCT Application No. PCT/US2020/061144", dated Feb. 24, 2021, 12 Pages.

* cited by examiner

*Primary Examiner* — Christopher R Zerphey
(74) *Attorney, Agent, or Firm* — Withrow & Terranova, PLLC

(57) ABSTRACT

A computing system includes a housing, processing circuitry, one or more additional components, and a cryogen evaporator plate. The housing includes a cryogen input port, a cryogen output port, and an interior chamber. The processing circuitry and the one or more additional components are in the interior chamber of the housing. The cryogen evaporator plate is thermally coupled to the processing circuitry and configured to receive a cryogen via the cryogen input port, cool the processing circuitry using the cryogen such that the cryogen is evaporated during the cooling of the processing circuitry to provide evaporated cryogen, and provide the evaporated cryogen into the interior chamber of the housing such that the evaporated cryogen is distributed over the one or more additional components to cool the one or more additional components.

21 Claims, 5 Drawing Sheets

SYSTEMS AND METHODS FOR COOLING A COMPUTING SYSTEM

FIELD OF THE DISCLOSURE

The present disclosure relates to systems and methods for cooling a computing system.

BACKGROUND

Typically, processing circuitry such as complementary metal-oxide-semiconductor (CMOS) based processing circuitry operates at temperatures around 100° C. If the temperature of processing circuitry is lowered significantly (e.g., between −95° C. and −200° C.), the performance of the processing circuitry can be significantly enhanced. For example, a speed of the processing circuitry can be significantly increased and/or an efficiency of the processing circuitry can be significantly improved.

Cryogenics have been investigated for their applications in cooling processing circuitry in order to achieve the performance improvements discussed above. State of the art cryogenic cooling systems for processing circuitry are primitive, relying on open-loop systems in which a cryogen such as liquid nitrogen is poured into a container that is thermally coupled to the processing circuitry. This container is often referred to as a "pot" and thus such systems are often referred to as pot-based cooling systems. The cryogen has an extremely low temperature and thus when placed in the pot, the cryogen significantly cools the processing circuitry.

While pot-based cooling systems effectively cool processing circuitry to achieve significant performance gains, they are associated with several problems. First, pot-based cooling systems are open-loop systems in which the cryogen evaporates out of the pot and into the surrounding environment. This means that the cryogen must be constantly replenished to continue cooling the processing circuitry. Without replenishment of the cryogen, the cooling time of a pot-based cooling system is quite low. Second, due to the significant temperature difference between the pot and the surrounding environment, condensation often forms around the pot and the processing circuitry. The condensation may cause electrical shorts that damage the processing circuitry and other surrounding components. Third, there is very little control over the temperature of the processing circuitry in a pot-based cooling system. The lack of control over the temperature of the processing circuitry may result in "freezing" the processing circuitry wherein the temperature of the processing circuitry becomes too low for the processing circuitry to properly function. Finally, pot-based cooling systems are not scalable.

In light of the above, there is a need for improved systems and methods for cooling a computing system.

SUMMARY

In one embodiment, a computing system includes a housing, processing circuitry, one or more additional components, and a cryogen evaporator plate. The housing includes a cryogen input port, a cryogen output port, and an interior chamber. The processing circuitry and the one or more additional components are in the interior chamber of the housing. The cryogen evaporator plate is thermally coupled to the processing circuitry and configured to receive a cryogen via the cryogen input port, cool the processing circuitry using the cryogen such that the cryogen is evaporated during the cooling of the processing circuitry to provide evaporated cryogen, and provide the evaporated cryogen into the interior chamber of the housing such that the evaporated cryogen is distributed over the one or more additional components to cool the one or more additional components. Using the cryogen evaporator plate in this manner allows the processing circuitry to be directly cooled using the cryogen and the one or more additional components to be cooled indirectly by the cryogen, thereby improving the performance of the computing system.

In one embodiment, the computing system further comprises a cryogen distribution system. The cryogen distribution system is configured to recover the evaporated cryogen via the cryogen output port, process the evaporated cryogen to provide the cryogen, and provide the cryogen to the cryogen input port. By using the cryogen distribution system to recapture and reuse the evaporated cryogen, a closed-loop cooling system is provided in which the processing circuitry and one or more additional components can be reliably cooled.

In one embodiment, a method includes receiving a cryogen at a cryogen evaporator plate, wherein the cryogen evaporator plate is thermally coupled to processing circuitry and the processing circuitry is located within an interior chamber of a housing. The method further includes cooling the processing circuitry using the cryogen such that the cryogen is evaporated during the cooling of the processing circuitry to provide an evaporated cryogen. The method further includes providing the evaporated cryogen into the interior chamber of the housing such that the evaporated cryogen is distributed over the one or more additional components in the interior chamber of the housing to cool the one or more additional components. Using the cryogen evaporator plate in this manner allows the processing circuitry to be directly cooled using the cryogen and the one or more additional components to be cooled indirectly by the cryogen, thereby improving the performance of the computing system.

In one embodiment, the method further includes recovering the evaporated cryogen via a cryogen output port in the housing, processing the evaporated cryogen to provide the cryogen, and providing the cryogen to the cryogen evaporator plate via a cryogen input port in the housing, wherein the cryogen input port is coupled to the cryogen evaporator plate. By recapturing and reusing the evaporated cryogen, a closed-loop cooling system is provided in which the processing circuitry and one or more additional components can be reliably cooled.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
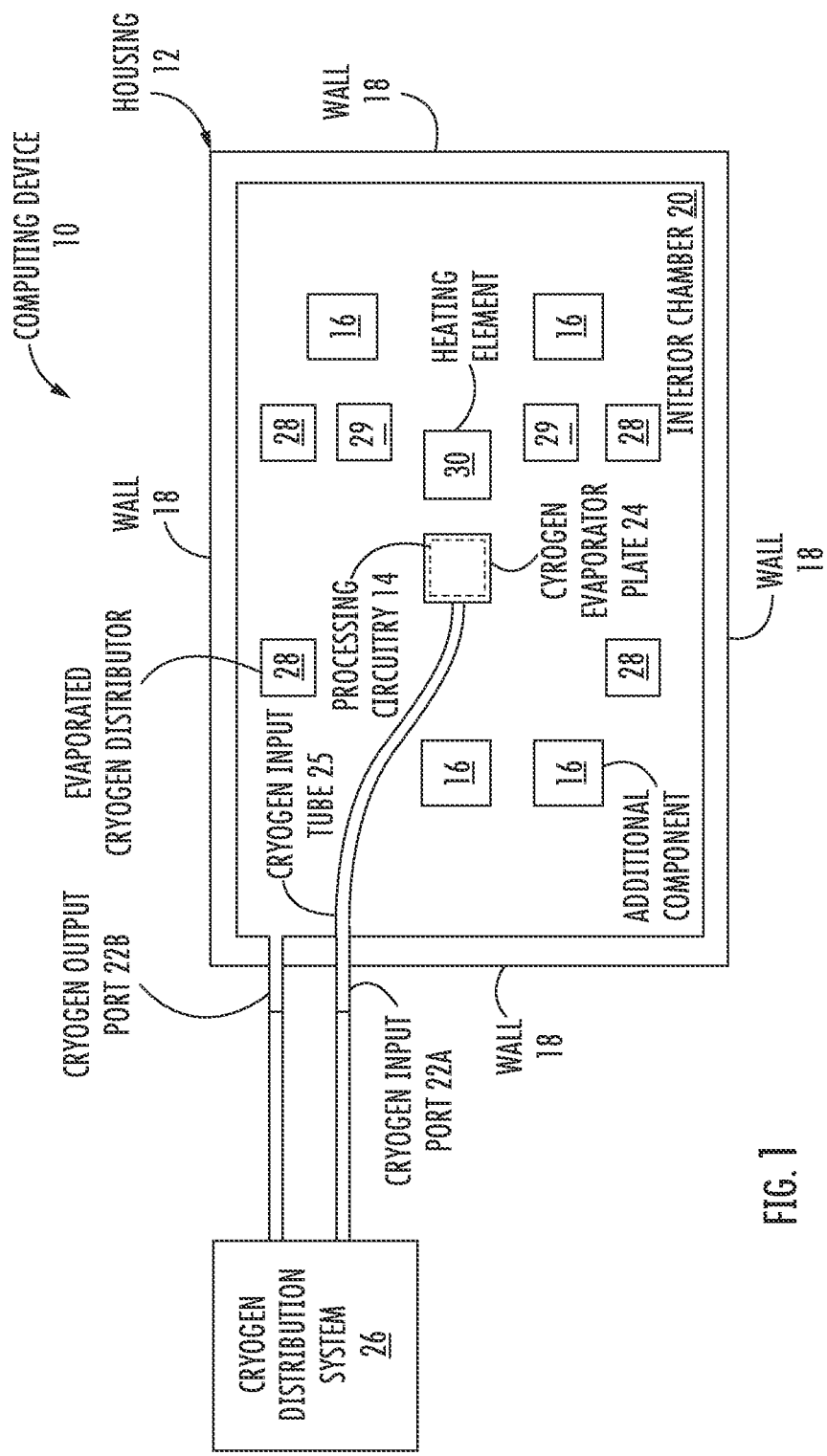
FIG. 1 illustrates a computing system with improved cooling according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 shows a computing device 10 with improved cooling according to one embodiment of the present disclosure. The computing device 10 includes a housing 12, processing circuitry 14 in the housing 12, and one or more additional components 16 in the housing 12. The one or more additional components 16 may include memory circuitry (e.g., static random access memory (SRAM), dynamic random access memory (DRAM), or the like), data storage circuitry (e.g., a hard drive, a solid state drive, or the like), input/output circuitry (e.g., networking circuitry, serial communications circuitry, or the like), connecting circuitry (e.g., a motherboard, bus circuitry, or the like), power supply circuitry, or any other components that make up part of a typical computing system. The housing 12 may include walls 18 that provide an interior chamber 20 in which the processing circuitry 14 and the one or more additional components 16 are provided. In some embodiments, the walls 18 may be thermally insulated. Further, the interior chamber 20 may be sealed to be air-tight or semi-air-tight.

To improve the cooling of the computing device 10, the housing 12 includes a cryogen input port 22A and a cryogen output port 22B. The cryogen input port 22A is coupled to a cryogen evaporator plate 24 via a cryogen input tube 25, which is thermally coupled to the processing circuitry 14. The cryogen output port 22B provides access to the interior chamber 20 of the housing 12. A cryogen distribution system 26 is coupled to the cryogen input port 22A and the cryogen output port 22B.

In operation, the cryogen distribution system 26 provides a cryogen (e.g., liquid nitrogen, liquid air, or any other suitable cryogen including a gaseous or evaporated cryogen) to the cryogen input port 22A. As discussed herein, the cryogen may include substances with boiling points below about 300 K and in the range of 4 K to 300 K, such that the cryogen referred to herein may include substances that are sometimes also referred to as refrigerants in addition to those normally referred to as cryogens. As discussed above, the cryogen input port 22A is coupled to the cryogen evaporator plate 24, which is thermally coupled to the processing circuitry 14. The cryogen evaporator plate 24 thus receives the cryogen and is configured such that the cryogen cools the processing circuitry 14. In the process of cooling the processing circuitry 14, the cryogen is evaporated to provide evaporated cryogen. In particular, the cryogen evaporator plate 24 is configured to allow the cryogen to evaporate into evaporated cryogen, which is released into the interior chamber 20 of the housing 12, where it is distributed over the one or more additional components 16 such that the evaporated cryogen cools the one or more additional components 16. In some embodiments, the interior chamber 20 of the housing 12 includes one or more evaporated cryogen distributors 28 arranged and configured to direct the evaporated cryogen towards at least one of the one or more additional components 16. The evaporated cryogen distributors 28 may be fans, which are controllable on an individual basis to direct evaporated cryogen towards at least one of the one or more additional components in the computing system. One or more temperature sensors 29 may be distributed in the housing 12 to measure a temperature of the one or more additional components 16 and control the evaporated cryogen distributors 28 accordingly.

The cryogen distribution system 26 recaptures the evaporated cryogen from the interior chamber 20 of the housing 12 via the cryogen output port 22B. The cryogen distribution system 26 then processes the evaporated cryogen in order to continue to circulate cryogen in the closed system. In one embodiment, the cryogen is a liquid and the evaporated cryogen is a gas. Accordingly, processing the evaporated cryogen to provide the cryogen may comprise condensing the evaporated cryogen back to a liquid cryogen, for example, by pressurizing the cryogen to a pressure greater than 100 kPa and cooling the cryogen to a temperature below 100K (where the temperature of the cryogen may be ~300K when recaptured from the interior chamber 20 of the housing 12). In some embodiments, however, processing the evaporated cryogen may comprise pressurizing and/or cooling but not fully condensing the evaporated cryogen. In these embodiments, the pressurized and/or cooled evaporated cryogen is provided to the cryogen evaporator plate 24, and the cryogen evaporator plate 24 is configured to expand the cooled evaporated cryogen such that sudden expansion liquidation occurs. The resulting cryogen then cools the processing circuitry 14 and is evaporated as discussed above.

In some situations, it may be difficult to control the temperature of the processing circuitry 14 using the cryogen evaporator plate 24 and the cryogen distribution system 26. Accordingly, in one embodiment, a heating element 30 is provided in the housing 12. The heating element 30 may ensure that the temperature of the evaporator plate 24 remains above a temperature (e.g., the boiling temperature of the cryogen used) so that the cryogen is fully evaporated during the cooling of the processing circuitry 14. In some embodiments, the heating element 30 may ensure that the temperature of the processing circuitry 14 remains above a certain temperature to avoid "freezing" thereof. Accordingly, one or more temperature sensors 29 configured to measure the temperature of the evaporator plate 24 and/or processing circuitry 14 may be provided and used to control the heating element 30. The heating element 30 may be thermally coupled to the evaporator plate 24 and/or the processing circuitry 14 in order to provide heat directly or indirectly thereto. In general, the heating element 30 may be provided to offset the cooling effect of the cryogen evaporator plate and the cryogen distribution system 26, since the heating element 30 may provide highly granular control over the temperature thereof. The heating element 30 may comprise any suitable element for providing heat in a well-controlled manner. For example, the heating element 30 may comprise an electrical heating element.

Figure 2:
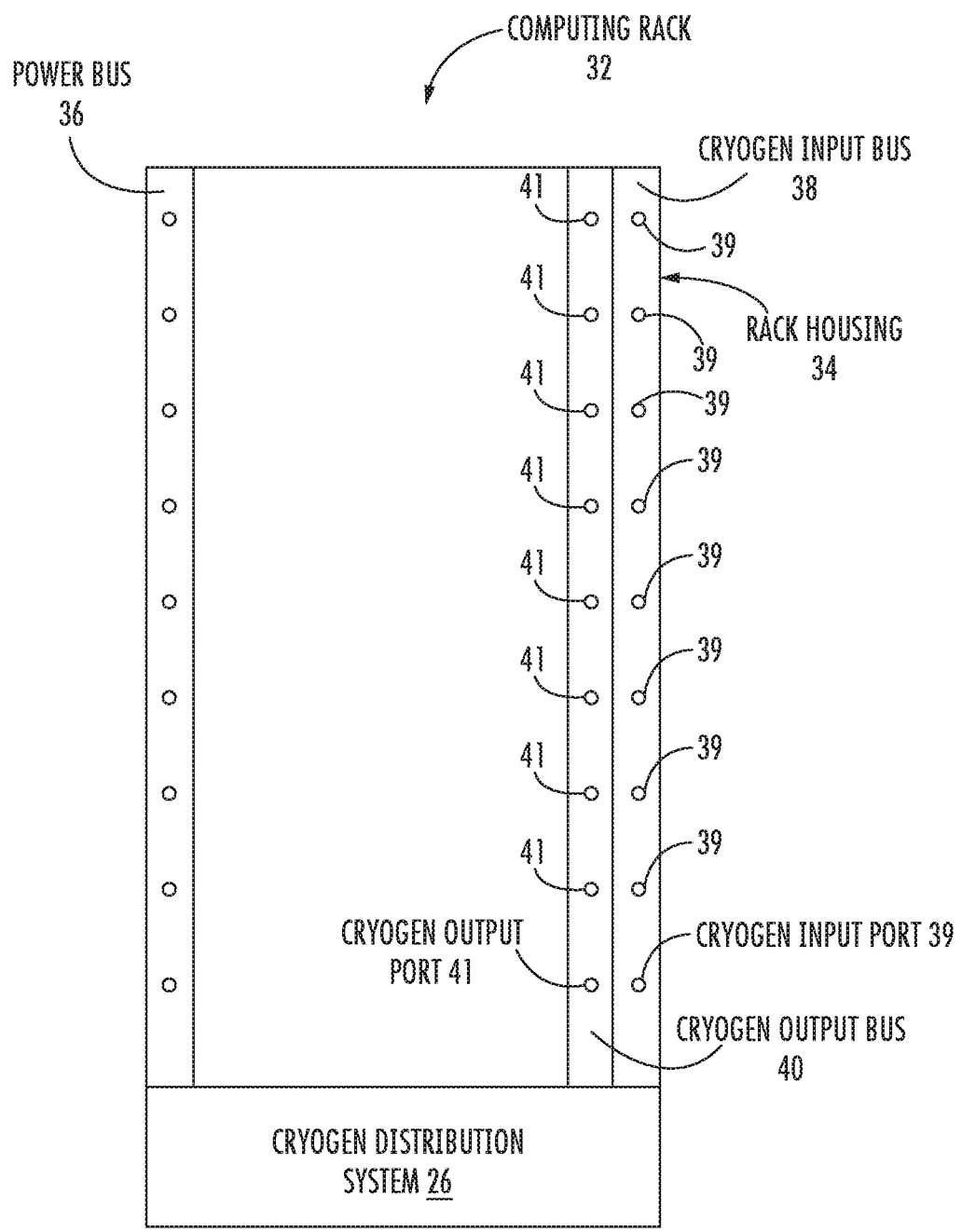
FIG. 2 illustrates a computing rack for improved cooling of one or more computing systems according to one embodiment of the present disclosure.

The housing 12 may be shaped and sized to be provided in a standardized enclosure such as a computing rack 32, the details of which are shown in FIG. 2 according to one embodiment of the present disclosure. The computing rack 32 includes a rack housing 34, a power bus 36, a cryogen input bus 38, a cryogen output bus 40, and the cryogen distribution system 26. The computing rack 32 is configured to house and provide cryogenic cooling for a plurality of computing systems. For example, the housing 12 of the computing device 10 is configured to be provided in the rack housing 34 of the computing rack 32 along with one or more other computing systems. In one embodiment, the computing rack 32 and the housing 12 of the computing device 10 may be configured such that providing the housing 12 in the rack housing 34 results in the automatic connection of the cryogen input port 22A to the cryogen input bus 38, the cryogen output port 22B to the cryogen output bus 40, and a power input connector (not shown) of the housing 12 to the power bus 36. For example, the cryogen input port 22A and the cryogen output port 22B may comprise dripless connectors configured to mate with a matching dripless connector in the cryogen input bus 38 and the cryogen output bus 40, respectively. Further, the cryogen input port 22A and the cryogen output port 22B may be insulated connectors to avoid freezing of air and other surrounding environmental contaminants due to cryogen being passed through them. The cryogen input bus 38 includes a number of cryogen input ports 39. The cryogen output bus 40 includes a number of cryogen output ports 41. The cryogen input bus 38 and the cryogen output bus 40 may be arranged to be at a rear of the rack housing 34 in a particular location so that a cryogen input port 39 in the cryogen input bus 38 is physically aligned with the cryogen input port 22A of the housing 12 of the computing device 10 and a cryogen output port 41 in the cryogen output bus 40 is physically aligned with the cryogen output port 22B in the housing 12 of the computing device 10 when the housing 12 is provided in the rack housing 34. Accordingly, when the housing 12 of the computing device 10 is provided in the rack housing 34, the cryogen input port 22A can automatically mate with a cryogen input port 39 in the cryogen input bus 38 and the cryogen output port 22B can automatically mate with a cryogen output port 41 in the cryogen output bus 40. The cryogen distribution system 26 is coupled to each one of the cryogen input ports 39 of the cryogen input bus 38 to provide the cryogen thereto and coupled to each one of the cryogen output ports 41 of the cryogen output bus 40 to collect evaporated cryogen therefrom.

In other embodiments, the cryogen input bus 38 and the cryogen output bus 40 may be arranged at a front of the rack housing 34 such that tubes can be easily connected between a cryogen input port 39 on the cryogen input bus 38 and the cryogen input port 22A of the housing 12 of the computing device 10 and a cryogen output port 41 on the cryogen output bus 40 and the cryogen output port 22B of the housing of the computing device 10. Generally, the cryogen input port 22A may be connected in any suitable manner to a cryogen input port 39 on the cryogen input bus 38 and the cryogen output port 22B may be connected in any suitable manner to a cryogen output port 41 on the cryogen output bus 40.

The cryogen input port 22A, the cryogen output port 22B, the cryogen input bus 38, and the cryogen output bus 40 may be configured such that the housing 12 can be removed from the rack housing 34 with minimal loss of cryogen. Accordingly, a shutoff control may be provided on the computing rack 32 or the computing device 10, which may be operated by a user to seal one or more of the cryogen input port 22A, the cryogen output port 22B, and one or more ports on the cryogen input bus 38 and the cryogen output bus 40 such that the housing 12 can be removed from the rack housing 34 without leaking cryogen or evaporated cryogen. In one embodiment, the cryogen distribution system 26 may provide a purge functionality, which allows a user to purge cryogen and evaporated cryogen from a given computing device 10 in the computing rack 32 such that the computing device 10 can be removed from the computing rack 32 without leaking cryogen.

In one embodiment, the interior chamber 20 of the housing 12 is not sealed such that the evaporated cryogen can escape from the interior chamber 20. In such embodiments, the housing 12 is enclosed in a larger sealed environment, such as one provided by the rack housing 34 of the computing rack 32. In such an embodiment, the cryogen output port 22B of the housing 12 may be omitted and the evaporated cryogen may be recaptured from the larger enclosed environment by the centralized cryogen distribution system 26.

As shown, the cryogen distribution system 26 may be provided as part of the computing rack 32. Accordingly, the cryogen distribution system 26 may provide the aforementioned functionality of providing cryogen, recovering evaporated cryogen, and processing the evaporated cryogen to provide the cryogen for a number of computing devices 10 in the computing rack 32. In some embodiments, the cryogen distribution system 26 may provide the aforementioned functionality of providing cryogen, recovering evaporated cryogen, and processing the evaporated cryogen to provide the cryogen for a number of computing racks 32. To do so, the cryogen distribution system 26 may be coupled to the cryogen input bus 38 of each of the computing racks 32 and the cryogen output bus 40 of each one of the computing racks 38. In some embodiments, the computing racks 32 may include additional master cryogen input ports and master cryogen output ports for receiving cryogen from a centralized cryogen distribution system 26 and providing evaporated cryogen back to the centralized cryogen distribution system 26. These ports may be located in a location that makes it convenient to connect the computing racks 32 to the centralized cryogen distribution system 26. Cryogen may be distributed to several computing racks 32 in any desired fashion. For example, a number of computing racks 32 may be individually connected to the cryogen distribution system 26 such that each computing rack 32 includes a separate cryogen loop. In other embodiments, a number of computing racks 32 may be coupled in series in a single cryogen loop with the cryogen distribution system 32. The computing racks 32 and the cryogen distributions system 26 may be provided in an insulated environment such as a cold box to avoid having to insulate various connections between each computing rack 32 and the cryogen distribution system 26.

Figure 3:
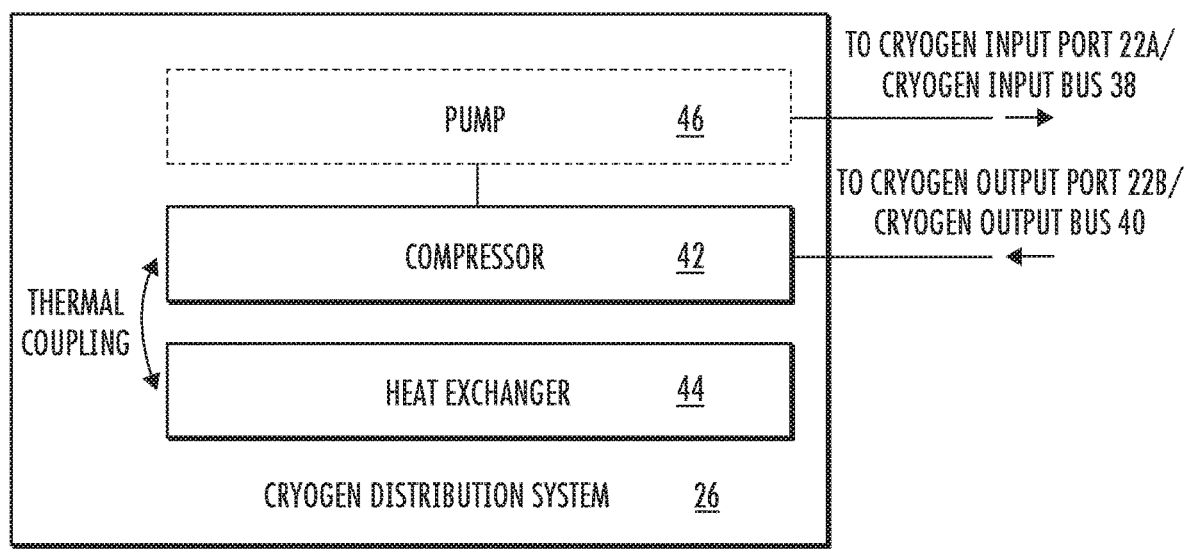
FIG. 3 illustrates details of a cryogen distribution system for improved cooling of one or more computing systems according to one embodiment of the present disclosure.

FIG. 3 shows details of the cryogen distribution system 26 according to one embodiment of the present disclosure. The cryogen distribution system 26 includes a compressor 42 and a heat exchanger 44, which are thermally coupled. The compressor 42 is coupled between the cryogen input port 22A or the cryogen input bus 38 and the cryogen output port 22B or the cryogen output bus 40, depending on whether the cryogen distribution system 26 is used for a single computing device 10 or for a computing rack 32. As discussed above, in some embodiments the cryogen distribution system 26 may be a centralized system for several computing racks and thus the compressor 42 may be coupled between several cryogen input busses 38 and several cryogen output busses 40. In some embodiments, an additional pump 46 may be coupled between the compressor 42 and the cryogen input port 22A or cryogen input bus(es) 38. The additional pump 46 is optional and thus shown as a dashed box. The compressor 42 receives the evaporated cryogen, which is a gas, from the cryogen output port 22B and compresses the evaporated cryogen to provide the cryogen, which is a liquid. In the process of compressing the evaporated cryogen, the compressor 42 generates heat. This heat may be dissipated via the heat exchanger 44, which may be a water-cooling system, an air-cooling system, or any other suitable heat exchanging system that is thermally coupled to the compressor 42. The cryogen recaptured from the evaporated cryogen is provided from the compressor 42 to the cryogen input port 22A. The additional pump 46 may be provided to pump the cryogen to the cryogen input port 22A at a desired rate and pressure that may not be achievable by the compressor 42 alone in some embodiments. Notably, the details of the cryogen distribution system 26 shown in FIG. 3 are merely exemplary. Those skilled in the art will readily appreciate that the present disclosure contemplates any suitable equipment for generating a cryogen from an evaporated cryogen.

As discussed above, in some embodiments the cryogen distribution system 26 may not compress the evaporated cryogen back into a liquid before providing it to the cryogen input port 22A. In such embodiments, the cryogen distribution system 26 may pressurize and/or cool the evaporated cryogen, for example, to a pressure above 100 kPa and a temperature below 300 K (e.g., less than 250K, less than 200K, and less than 100K in various embodiments) and provide it as a pressurized gas back to the cryogen input port 22A. As the pressurized gas is passed through the cryogen evaporator plate 24, it expands causing sudden expansion liquidation to provide the cryogen. Accordingly, the present disclosure refers to the cryogen distribution system 26 as generally processing the evaporated cryogen to provide the cryogen. In various embodiments, this may comprise compressing or otherwise changing the state of the evaporated cryogen, cooling the evaporated cryogen to a desired temperature, or any other suitable processing of the evaporated cryogen.

Figure 4:
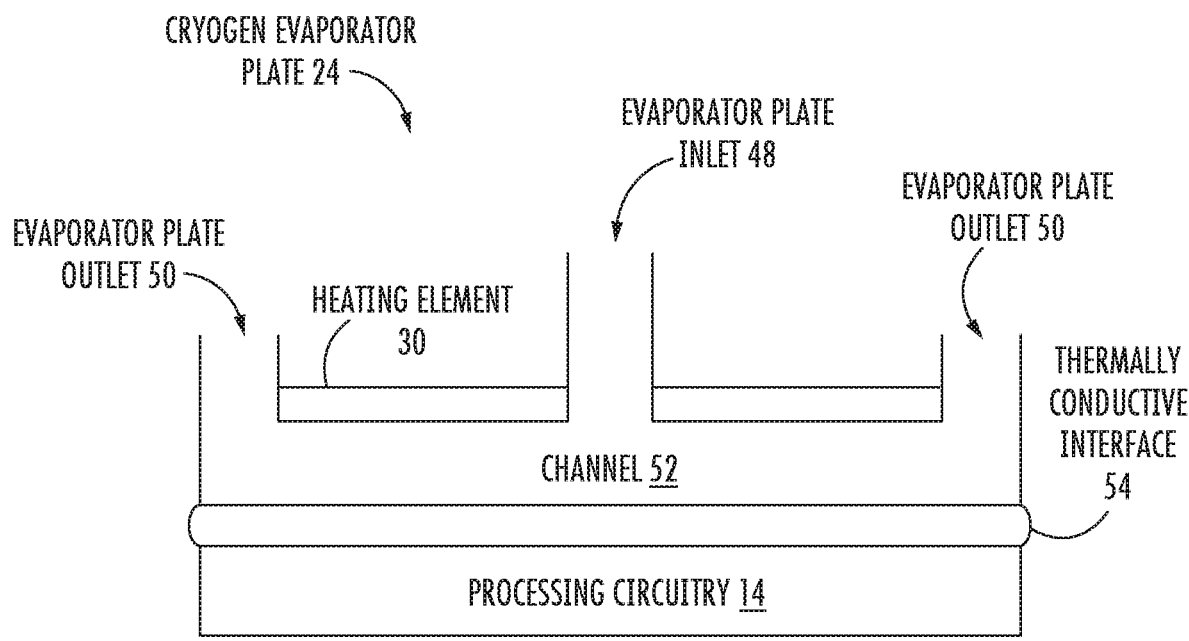
FIG. 4 illustrates details of a cryogen evaporator plate for improved cooling of a computing system according to one embodiment of the present disclosure.

FIG. 4 shows a cross-sectional view of the cryogen evaporator plate 24 according to one embodiment of the present disclosure. As shown, the cryogen evaporator plate 24 includes an evaporator plate inlet 48 and an evaporator plate outlet 50. A channel 52 is provided between the evaporator plate inlet 48 and the evaporator plate outlet 50. The evaporator plate inlet 48 is coupled to the cryogen input port 22A of the housing 12. Accordingly, cryogen is provided to the evaporator plate inlet 48. The cryogen cools the processing circuitry 14, and in this process evaporates into evaporated cryogen. The evaporator plate outlet 50 is open to the interior of the housing 12 such that the evaporated cryogen is distributed in the interior of the housing 12 and used to cool the one or more additional components 16 as discussed above. Notably, the cryogen evaporator plate 24 shown in FIG. 4 is merely exemplary. The cryogen evaporator plate 24 may be sized and shaped to provide a desired rate of evaporation of the cryogen, a desired pressure of the cryogen, or any other desired parameter. As discussed above, in some embodiments the cryogen evaporator plate 24 may be configured to cause sudden expansion of a cooled evaporated cryogen to provide sudden expansion liquidation. As shown in FIG. 4, the cryogen evaporator plate 24 is thermally coupled to the processing circuitry 14. This may mean that the cryogen evaporator plate 24 is physically in contact with the processing circuitry 14, either directly or indirectly, for example, via a thermally conductive interface 54 such as a thermal paste (not shown). FIG. 4 further shows the heating element 30 on top of the cryogen evaporator plate 24 opposite the processing circuitry 14. As discussed above, this may give the heating element 30 a direct thermal interface with the cryogen evaporator plate 24 to ensure that the cryogen evaporator plate 24 is kept at a temperature suitable for evaporating the cryogen provided thereto and to ensure that the processing circuitry 14 continues to function as desired.

Figure 5:
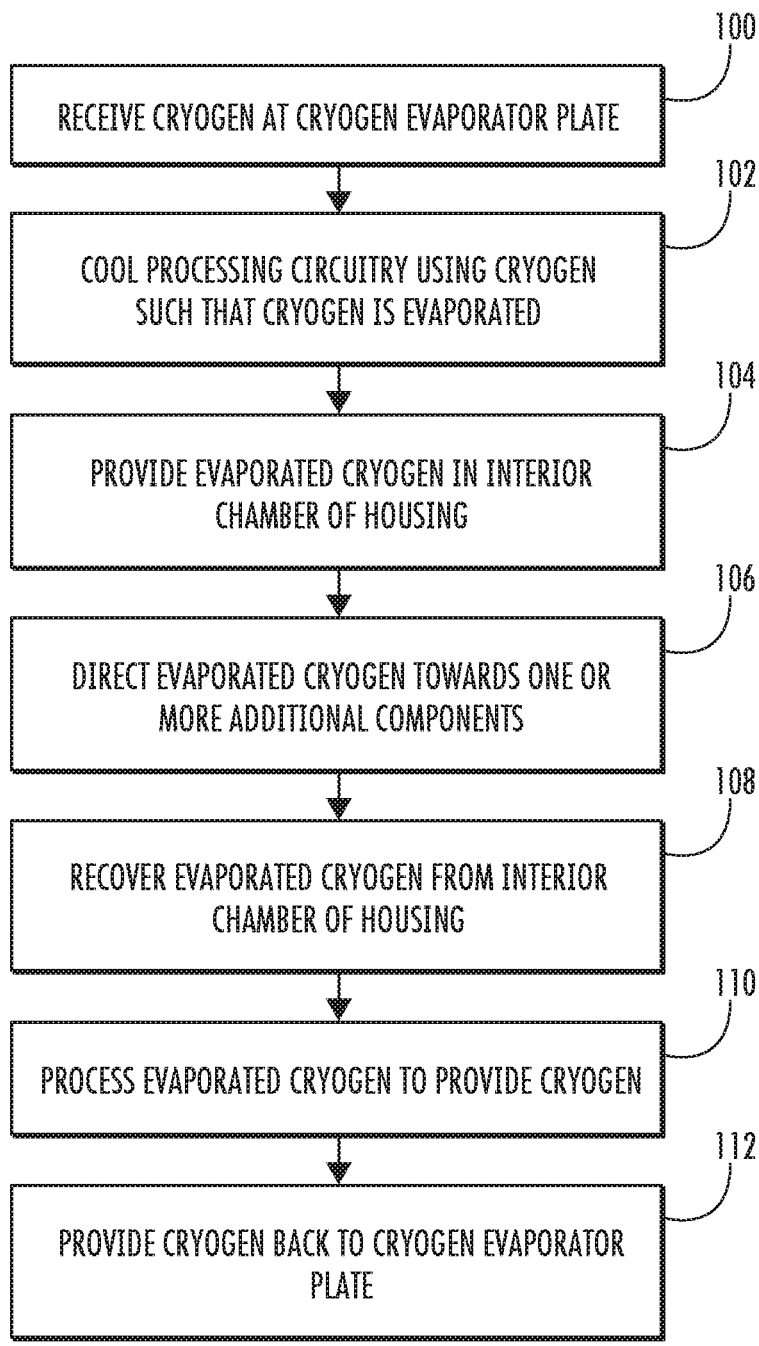
FIG. 5 is a flow diagram illustrating an improved method for cooling a computing system according to one embodiment of the present disclosure.

FIG. 5 is a flow diagram illustrating a method for cooling a computing system according to one embodiment of the present disclosure. The method includes receiving a cryogen at the cryogen evaporator plate 24 (block 100). As discussed above, the cryogen evaporator plate 24 is thermally coupled to the processing circuitry 14, and the processing circuitry 14 is located within the interior chamber 20 of the housing 12. The processing circuitry 14 is cooled using the cryogen such that the cryogen is evaporated during the cooling of the processing circuitry 14 to provide an evaporated cryogen (block 102). The evaporated cryogen is provided into the interior chamber 20 of the housing 12 (block 104) such that the evaporated cryogen is distributed over the one or more additional components 16 in the interior chamber 20 of the housing 12 to cool the one or more additional components 16.

The evaporated cryogen may be directed towards at least one of the one or more additional components via one or more evaporated cryogen distributors (block 106), which as discussed above may comprise fans. The evaporated cryogen in the interior chamber 20 of the housing 12 may be recovered (block 108), for example, by the cryogen distribution system 26. The evaporated cryogen is processed to provide the cryogen (block 110), for example, by condensing the evaporated cryogen into a liquid or pressurizing and/or cooling the evaporated cryogen to a desired temperature. The cryogen may then be provided to the cryogen evaporator plate 24 (block 112) to restart the process at block 100.

The discussion above illustrates systems and methods for cooling one or more computing systems in a closed-loop fashion such that a cryogen is used to directly cool processing circuitry and evaporated cryogen resulting from the direct cooling of the processing circuitry is used to cool one or more additional components. The principles discussed above provide several advantages over pot-based cooling systems discussed above in the background. First, the systems and methods discussed herein allow for reliable cooling of processing circuitry for long periods of time without replenishment of cryogen. Next, by enclosing the processing circuitry and one or more additional components in an interior chamber of a housing, which may be sealed and insulated, condensation due to large temperature differences between an area that is being cryogenically cooled and an area that is not can be avoided. Using a heating element in the computing system allows for precise control over the temperature of the processing circuitry, thereby preventing "freezing" thereof. Finally, the computing system and computing rack discussed above are scalable to a large number of computing systems, and even compatible with current footprints and requirements for current air-cooled data center applications such that they can essentially be dropped in place of a similar air-cooled system. The cooling systems and methods discussed herein may provide a coefficient of performance (CoP) greater than or equal to five.

Those skilled in the art will recognize improvements and modifications to the preferred embodiments of the present disclosure. All such improvements and modifications are considered within the scope of the concepts disclosed herein and the claims that follow.

What is claimed is:

1. A computing system comprising:
a housing comprising a cryogen input port, a cryogen output port, and an interior chamber;
processing circuitry in the interior chamber of the housing;
one or more additional components in the interior chamber of the housing;
a heating element in the interior chamber of the housing;
a cryogen evaporator plate thermally coupled to the processing circuitry and configured to receive a cryogen via the cryogen input port, cool the processing circuitry using the cryogen and output evaporated cryogen into the interior chamber of the housing such that the evaporated cryogen is distributed over the one or more additional components to cool the one or more additional components; and
one or more temperature sensors configured to measure at least one of a temperature of the cryogen evaporator plate and a temperature of the processing circuitry, and configured to control the heating element, wherein:
the cryogen is converted to the evaporated cryogen during the cooling of the processing circuitry; and
the heating element and the processing circuitry are located on opposite sides of the cryogen evaporator plate, such that the heating element has a direct thermal interface with the cryogen evaporator plate without direct contact with the processing circuit, wherein the heating element is configured to maintain a temperature of the cryogen evaporator plate above a boiling temperature of the cryogen provided thereto and is configured to maintain a temperature of the processing circuitry above a certain temperature to prevent the processing circuitry from freezing.

2. The computing system of claim 1 further comprising a cryogen distribution system configured to:
recover the evaporated cryogen via the cryogen output port;
process the evaporated cryogen to provide the cryogen; and
provide the cryogen to the cryogen input port.

3. The computing system of claim 2 wherein processing the evaporated cryogen comprises condensing the evaporated cryogen.

4. The computing system of claim 2 further comprising one or more evaporated cryogen distributors in the housing, the one or more evaporated cryogen distributors configured to direct the evaporated cryogen towards at least one of the one or more additional components.

5. The computing system of claim 4 wherein each of the one or more evaporated cryogen distributors comprises a fan.

6. The computing system of claim 1 further comprising one or more evaporated cryogen distributors in the housing, the one or more evaporated cryogen distributors configured to direct the evaporated cryogen towards at least one of the one or more additional components.

7. The computing system of claim 6 wherein each of the one or more evaporated cryogen distributors comprises a fan.

8. The computing system of claim 1 wherein the one or more additional components comprise one or more of:
memory circuitry;
data storage circuitry; and
input/output circuitry.

9. The computing system of claim 1 wherein the interior chamber of the housing is sealed such that the evaporated cryogen is confined to the housing.

10. The computing system of claim 1 wherein the housing is thermally insulated.

11. The computing system of claim 1 wherein the cryogen evaporator plate is in indirect contact with the processing circuitry via a thermally conductive interface.

12. A method for cooling a computing system comprising:
receiving a cryogen at a cryogen evaporator plate, wherein the cryogen evaporator plate is thermally coupled to processing circuitry, and the processing circuitry is located within an interior chamber of a housing;
cooling the processing circuitry using the cryogen;
outputting evaporated cryogen into the interior chamber of the housing such that the evaporated cryogen is distributed over one or more additional components in the interior chamber of the housing to cool the one or more additional components, wherein the cryogen is converted to the evaporated cryogen during the cooling of the processing circuitry; and
measuring a temperature of at least one of the cryogen evaporator plate and the processing circuitry by one or more temperature sensors to control a heating element in the housing, wherein the heating element and the processing circuitry are located on opposite sides of the cryogen evaporator plate, such that the heating element has a direct thermal interface with the cryogen evaporator plate without direct contact with the processing circuit, and the heating element is configured to maintain a temperature of the cryogen evaporator plate above a boiling temperature of the cryogen provided thereto and is configured to maintain a temperature of the processing circuitry above a certain temperature to prevent the processing circuitry from freezing.

13. The method of claim 12 further comprising:
recovering the evaporated cryogen via a cryogen output port in the housing;
processing the evaporated cryogen to provide the cryogen; and
providing the cryogen to the cryogen evaporator plate via a cryogen input port in the housing, wherein the cryogen input port is coupled to the cryogen evaporator plate.

14. The method of claim 13 wherein processing the evaporated cryogen comprises condensing the evaporated cryogen.

15. The method of claim 13 further comprising directing the evaporated cryogen towards at least one of the one or more additional components via one or more evaporated cryogen distributors.

16. The method of claim 15 wherein each of the one or more evaporated cryogen distributors comprises a fan.

17. The method of claim 12 further comprising directing the evaporated cryogen towards at least one of the one or more additional components via one or more evaporated cryogen distributors.

18. The method of claim 17 wherein each of the one or more evaporated cryogen distributors comprises a fan.

19. The method of claim 12 wherein the one or more additional components comprise one or more of:
memory circuitry;
data storage circuitry; and
input/output circuitry.

20. The method of claim 12 wherein the interior chamber of the housing is sealed such that the evaporated cryogen is confined to the housing.

21. The method of claim 12 wherein the housing is thermally insulated.

* * * * *